(12) United States Patent  (10) Patent No.: US 7,301,276 B2
Yamazaki et al.  (45) Date of Patent: Nov. 27, 2007

(54) LIGHT EMITTING APPARATUS AND METHOD OF MANUFACTURING THE SAME

(75) Inventors: Shunpei Yamazaki, Tokyo (JP); Takeshi Fukunaga, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 09/815,563

(22) Filed: Mar. 23, 2001

(65) Prior Publication Data

US 2001/0024083 A1 Sep. 27, 2001

(30) Foreign Application Priority Data

Mar. 27, 2000 (JP) ............................. 2000-085866

(51) Int. Cl.
*H01J 1/62* (2006.01)
*H01J 63/04* (2006.01)

(52) U.S. Cl. ..................... 313/506; 313/505; 313/504; 313/498

(58) Field of Classification Search ................ 313/483, 313/497, 498–506, 495, 496; 428/690; 257/10, 100, 91, 99, 98
See application file for complete search history.

(56) References Cited

U.S. PATENT DOCUMENTS

| 4,137,481 A | * | 1/1979 | Hilsum et al. | ............... | 313/503 |
| 4,786,358 A |   | 11/1988 | Yamazaki et al. | ........... | 156/643 |
| 5,163,220 A | * | 11/1992 | Zeto et al. | ..................... | 29/846 |
| 5,227,252 A | * | 7/1993 | Murayama et al. | ......... | 428/690 |
| 5,399,936 A | * | 3/1995 | Namiki et al. | ............... | 313/504 |
| 5,400,047 A | * | 3/1995 | Beesely | ....................... | 313/503 |
| 5,643,826 A |   | 7/1997 | Ohtani et al. | .................. | 437/88 |
| 5,652,067 A | * | 7/1997 | Ito et al. | ...................... | 313/502 |
| 5,661,500 A | * | 8/1997 | Shinoda et al. | ............. | 313/485 |
| 5,923,962 A |   | 7/1999 | Ohtani et al. | ................ | 438/150 |
| 5,932,327 A | * | 8/1999 | Inoguchi et al. | ............ | 257/102 |
| 5,962,970 A | * | 10/1999 | Yokoi et al. | ................. | 313/506 |
| 6,008,588 A | * | 12/1999 | Fujii | .......................... | 313/498 |
| 6,037,712 A | * | 3/2000 | Codama et al. | ............. | 313/292 |
| 6,087,770 A | * | 7/2000 | Kaneko et al. | ............. | 313/310 |

(Continued)

FOREIGN PATENT DOCUMENTS

JP 7-130652 5/1995

OTHER PUBLICATIONS

Tsutsui, T. et al, "Electroluminescence in Organic Thin Films," Photochemical Processes in Organized Molecular Systems, pp. 437-450, 1991.

(Continued)

*Primary Examiner*—Joseph Williams
*Assistant Examiner*—Peter Macchiarolo
(74) *Attorney, Agent, or Firm*—Cook, Alex, McFarron, Manzo, Cummings & Mehler, Ltd.

(57) ABSTRACT

A light emitting apparatus with high homogeneity in image quality is provided, which includes anodes 102 on an insulator 101, cathodes 107 orthogonal to the anodes 102, and EL layers 106 interposed between the anodes 102 and the cathodes 107, and auxiliary wirings 103 are electrically connected to the anodes 102. The auxiliary wirings 103 are made of a material lower in resistance than that of the anodes 102, thereby being capable of reducing the wiring resistance of the anodes 102.

21 Claims, 12 Drawing Sheets

U.S. PATENT DOCUMENTS

| | | | |
|---|---|---|---|
| 6,133,581 A * | 10/2000 | Terao et al. | 313/504 |
| 6,246,179 B1 * | 6/2001 | Yamada | 313/498 |
| 6,320,311 B2 * | 11/2001 | Nakaya et al. | 313/506 |
| 6,359,606 B1 * | 3/2002 | Yudasaka | 345/87 |
| 6,366,025 B1 * | 4/2002 | Yamada | 313/498 |
| 6,380,673 B1 * | 4/2002 | Sekiya et al. | 313/504 |
| 6,479,930 B1 * | 11/2002 | Tanabe et al. | 313/509 |
| 6,528,824 B2 * | 3/2003 | Yamagata et al. | 438/149 |
| 6,570,321 B1 * | 5/2003 | Kusunoki et al. | 313/495 |
| 6,621,213 B2 * | 9/2003 | Kawashima | 313/506 |
| 6,710,542 B2 * | 3/2004 | Chun et al. | 313/506 |
| 6,730,966 B2 * | 5/2004 | Koyama | 257/350 |
| 6,856,089 B2 * | 2/2005 | Hosokawa et al. | 313/506 |
| 2003/0146693 A1 * | 8/2003 | Ishihara et al. | 313/504 |
| 2006/0147650 A1 * | 7/2006 | Park | 428/1.1 |

OTHER PUBLICATIONS

Baldo, M.A. et al, "Highly Efficient Phosphorescent Emission from Organic Electroluminescent Devices," Nature, vol. 395, pp. 151-154, Sep. 10, 1998.

Baldo, M.A. et al, "Very High-Efficiency Green Organic Light-Emitting Devices Based on Electrophosphorescence," Applied Physics Letters, vol. 75, No. 1, pp. 4-6, Jul. 5, 1999.

Tsutsui, T. et al, "High Quantum Efficiency in Organic Light-Emitting Devices with Iridium-Complex as a Triplet Emissive Center," Japanese Journal of Applied Physics, vol. 38, part 2, No. 12B, pp. L1502-L1504, Dec. 15, 1999.

English abstract re Japanese Patent Application No. 7-130652, published May 19, 1995.

* cited by examiner

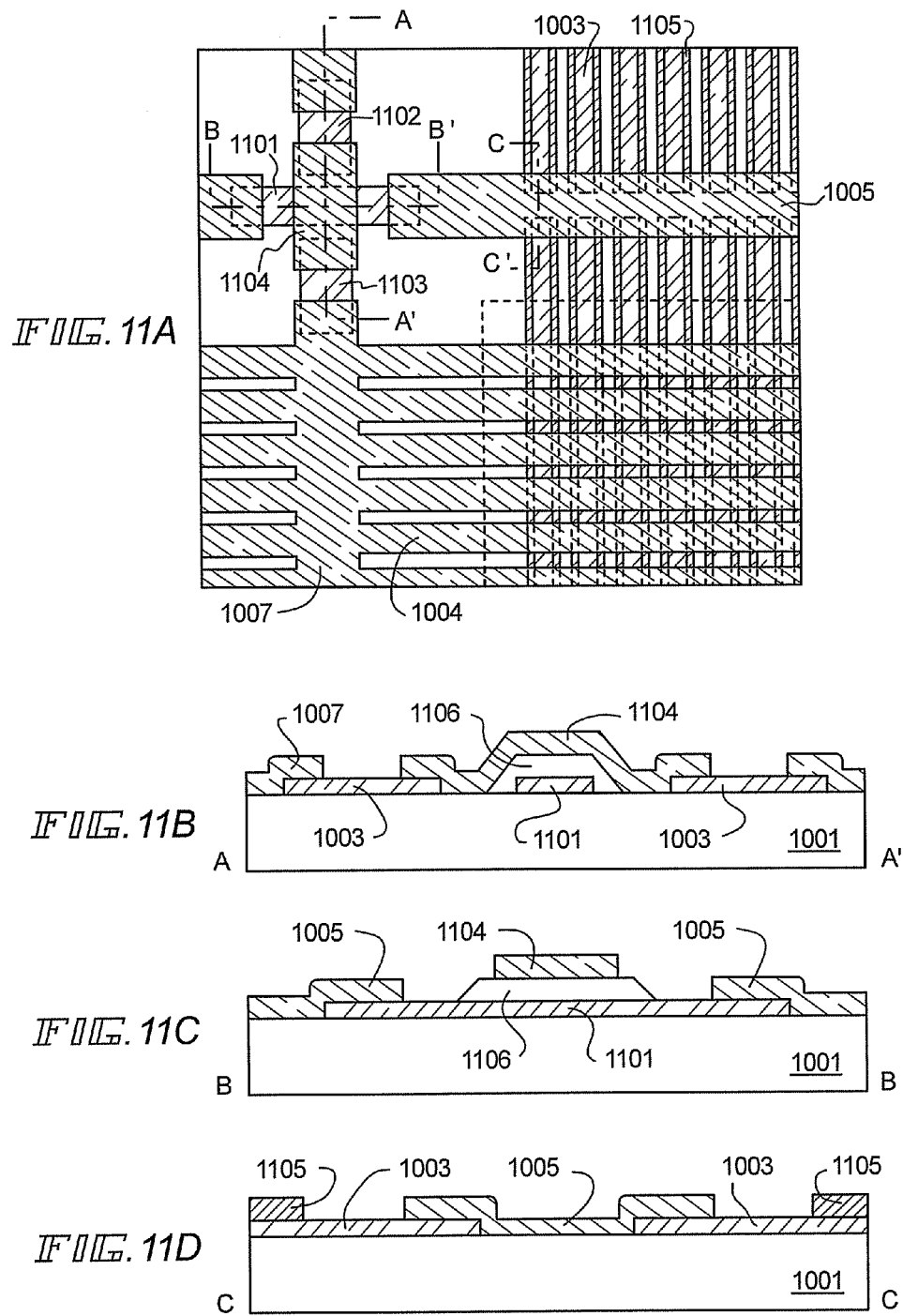

LIGHT EMITTING APPARATUS AND METHOD OF MANUFACTURING THE SAME

BACKGROUND OF THE INVENTION

1. Field of the Invention

The present invention relates to an apparatus (hereinafter referred to as "light emitting apparatus") having an element where a luminescent material is interposed between a pair of electrodes (hereinafter referred to as "luminescent element"). In particular, the present invention relates to a light emitting apparatus (hereinafter referred to as "EL light emitting apparatus") having a luminescent element (hereinafter referred to as "EL element") which utilizes a luminescent material (hereinafter referred to as "EL material") by which EL (electro luminescence) is obtained as the luminescent material. An organic EL display and an organic light emitting diode (OLED: organic light emitting diode) is contained in the light emitting apparatus according to the present invention.

Also, the EL material which can be used in the present invention includes all of the luminescent materials that emit a light (phosphorescence and/or fluorescence) through a singlet excitation, a triplet excitation or both excitations.

2. Description of the Related Art

The EL light emitting apparatus is so structured as to have an EL element with a structure where an EL material is interposed between an anode and a cathode. A voltage is applied between the anode and the cathode to allow a current to flow in the EL material, to thereby re-couple carriers and emit a light. In other words, the EL light emitting apparatus does not require a backlight used in a liquid crystal display device because the light emitting element per se has a light emitting capability. In addition, the EL light emitting apparatus is advantageous in that the apparatus is broad in an angle of visibility and light in weight.

A passive matrix (simple matrix) EL light emitting apparatus is structured in such a manner that a plurality of anodes which are arranged in the form of stripes (bands) in parallel with each other and a plurality of cathodes which are arranged in the form of stripes in parallel with each other are orthogonal to each other, and an EL material is interposed between the anode and the cathode at each of the cross portions. With this structure, a pixel which is at a cross point between a selected (voltage applied) anode and a selected cathode is lit. In other words, a voltage is applied between the anode and the cathode to allow a current to flow in the EL material, to thereby re-couple the carriers and emit a light. The above drive method is called "current drive".

However, there is a voltage drop (also called "IR drop") due to a wiring resistance as a phenomenon which is a problem on the EL light emitting apparatus of the current drive type. This is a phenomenon that a voltage drops more as a distance from the power supply becomes farther even if the same wiring is used. This problem is remarkable particularly in the case where the wiring length becomes long, and it is one of obstacles in enlarging a screen of the EL light emitting apparatus.

In particular, in the passive matrix EL light emitting apparatus, a transparent electrically conductive oxide film generally for a visible light is used as the anode, but the electrically conductive oxide film has a problem that the resistance is higher than a metal film, and, thus the conductive oxide film is liable to be influenced by the above-mentioned voltage drop.

There is a fear that the voltage drop caused by the wiring resistance and a signal delay remarkably damage the uniformity of an image quality, cause a residual image phenomenon and become an obstacle to the large screen. The above problems are remarkable particularly in a light emitting apparatus which is several tens inches in a diagonal line.

SUMMARY OF THE INVENTION

The present invention has been made to solve the above problems, and therefore an object of the present invention is to provide a light emitting apparatus which reduces the wiring resistance of an electrically conductive film which forms the electrodes of light emitting elements, to thereby improve the uniformity of an image quality of the light emitting apparatus and which is high in display quality. Another object of the present invention is to provide a light emitting apparatus which can be adapted to a large screen. Still another object of the present invention is to provide an electric device that uses the light emitting apparatus as a display portion which is high in display quality.

In order to achieve the above objects, according to the present invention, for the purpose of reducing the wiring resistance of anodes which are formed of an electrically conductive oxide film, auxiliary wirings are so disposed as to be electrically connected to the anodes.

The auxiliary wirings may be formed of wirings made of a metal film, and it is desirable to employ a material which can ensure the selective ratio to a material that forms the anodes. Specifically, there can be used a metal film including platinum, palladium, nickel, gold, aluminum, copper, silver, tantalum, tungsten, molybdenum or titanium.

BRIEF DESCRIPTION OF THE DRAWINGS

These and other objects and advantages of this invention will become more fully apparent from the following detailed description taken with the accompanying drawings in which:

FIGS. 11A to 11D are diagrams showing examples of the multiple beveling processes;

DETAILED DESCRIPTION OF THE PREFERRED EMBODIMENTS

Figure 1A:
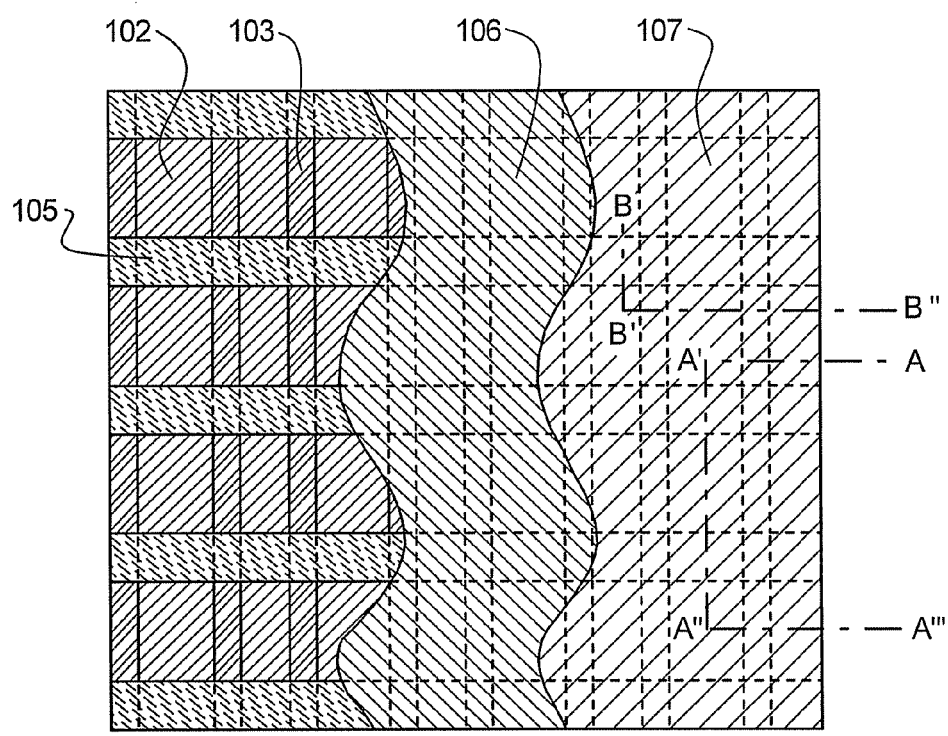
FIGS. 1A to 1C are diagrams showing a top structure and a cross-sectional structure of a light emitting apparatus.
Figure 1B:
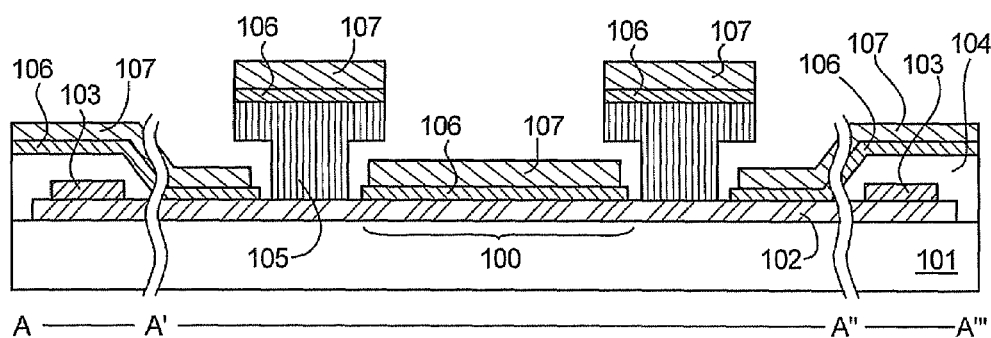
Figure 1C:
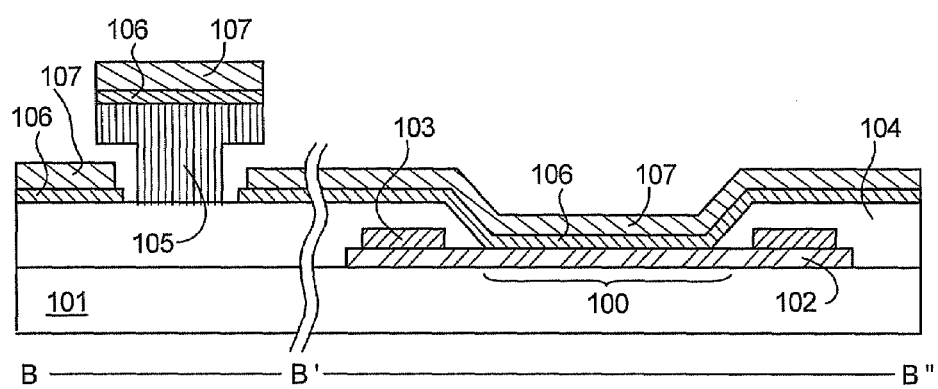

Now, a description will be given in more detail of preferred embodiments of the present invention with reference to FIGS. 1A to 1C. FIG. 1A is a top view showing a pixel portion of a light emitting apparatus in accordance with the present invention. FIG. 1B is a cross-sectional view taken along a line A-A'-A"-A'" in FIG. 1A, and FIG. 1C is a cross-sectional view taken along a line B-B'-B" in FIG. 1A. The light emitting apparatus shown in those figures is in a state before light emitting elements are sealed in the apparatus.

In the light emitting apparatus according to the present invention, a plurality of anodes 102 are first disposed on an insulating material 101. The insulating material 101 may be formed by disposing an insulating film on a glass substrate, a plastic substrate (including a plastic film), a metal substrate or a ceramics substrate, or may be formed by a quartz substrate as it is.

The plurality of anodes 102 are aligned in the form of bands (or in the form of lines) so as to be arranged in the form of stripes as a whole. Also, each of the anodes 102 is formed of an electrically conductive film which is large in work function, and representatively formed of an electrically conductive oxide film transparent with respect to a visible light. The electrically conductive oxide film may be formed an electrically conductive film made of indium oxide, tin oxide, zinc oxide or the compound of those materials. In addition, gallium may be added to those electrically conductive oxide film.

Then, the feature of the present invention resides in that a plurality of auxiliary wirings 103 may be disposed so as to be electrically connected to the anodes 102. The auxiliary wirings 103 are wirings for seemingly reducing the wiring resistances of the anodes 102, and it is preferable to use an electrically conductive film lower in resistance than the anodes 102. Representatively, it is better to employ a metal film including platinum, palladium, nickel, gold, aluminum, copper, silver, tantalum, tungsten, molybdenum or titanium. It is desirable that the selective ratio to the anodes 102 can be sufficiently ensured.

Also, in the case where the auxiliary wirings 103 are nontransparent with respect to the visible light, it is preferable to dispose the auxiliary wirings 103 in such a manner that the auxiliary wirings 103 are electrically connected to the anodes 102 at areas as small as possible. In this situation, since the effects of the present invention is obtained if the auxiliary wirings 103 are in contact with the anodes 102, the auxiliary wirings 103 may be disposed on the upper portion or the lower portion of the anodes 102.

As shown in FIG. 1B, the auxiliary wiring 103 is covered with a separation insulating film 104. The separation insulating film 104 is an insulating film which is disposed between the adjacent anodes and isolates the end portion of the anode 102 from the EL layer 106. The separation insulating film 104 may be formed of an insulating film containing silicon, representatively a silicon oxide film, a silicon nitride film, a silicon nitride oxide film or a silicon carbonate film.

Also, the structure shown in FIG. 1B is further designed in such a manner that the auxiliary wiring 103 is out of contact with the EL layer 106. This is to prevent a light emitting mechanism per se from being changed by the contact of the auxiliary wiring 103 with the EL layer 106. It is needless to say that it is possible to provide a structure in which the auxiliary wiring 103 and the EL layer 106 are in contact with each other if the above influence is eliminated.

Also, a plurality of banks 105 are so disposed as to be orthogonal to the anodes 102. Each of the banks 105 is an insulating film used as a mask material for patterning the EL layer 106 and the cathode 107 which are formed on the bank 105. The bank 105 may be formed of an insulating film (hereinafter referred to as "resin film") made of resin. The resin may be representatively polyimide, polyamide, acrylic resin, epoxy resin or novolak resin.

Also, the bank 105 is narrower in the width of a lower layer side and shaped in a convex turned upside down. This shape can be realized by the combination of two insulating film layers different in etching rate. In other words, if the lower layer of the bank 105 is higher in the etching rate than the upper layer thereof, the width of the lower layer of the bank 105 can be narrowed through isotropic etching.

In addition, the EL layer 106 and the cathode 107 are disposed in parallel with the bank 105 (so as to be orthogonal to the anode 102). The EL layer 106 and the cathode 107 are separated in the form of bands by the bank 105 and disposed in the form of stripes as a whole. It is needless to say that the individual cathodes separated in the form of bands are electrically insulated from each other.

In the present specification, the EL layer is directed to an insulating layer or a semiconductor layer which is disposed between the anode and the cathode in the EL element and formed by the combination of various organic films or inorganic films. Representatively, the EL layer includes at least a light emitting layer and uses the combination of a charge implantation layer and a charge transport layer with the light emitting layer. Also, the EL layer 106 may be made of an organic EL material, an inorganic EL material or an EL material that combines those materials together. Also, the organic EL material may be made of a low molecular material or a high molecular material, or any well-known material.

Also, the cathode 107 may be formed of an electrically conductive film small in work function, representatively, an electrically conductive film containing Group I or Group II of the periodic table. Representatively, an alloy film containing magnesium, lithium, cesium, beryllium, potassium, or calcium. Also, a bismush film may be used.

The anode 102, the EL layer 106 and the cathode 107 form the EL element 100. In fact, a resin film is disposed on the EL element 100 as a sealant, or a closed space is defined on the EL element 100, to thereby protect the EL element 100 from the atmosphere. The reason is that because the EL layer 106 or the cathode 107 is deteriorated by oxidation, they are prevented from coining in contact with oxygen or water as much as possible.

The light emitting apparatus thus structured according to the present invention connects the anode 102 formed of the electrically conductive oxide film to the auxiliary wiring 103 lower in resistance than the anode 102, thereby being capable of reducing the wiring resistance of the anode 102 seemingly. Therefore, the unevenness of the image quality due to the voltage drop can be prevented, to thereby obtain a light emitting apparatus high in display quality.

First Embodiment

A light emitting apparatus in accordance with an embodiment of the present invention will be described with reference to FIG. 2. A pixel portion 202 is formed on a substrate 201 on which light emitting elements are formed. On the pixel portion 202, a scanning line (in this example, laminate wirings including anodes and auxiliary wirings) group 203 and a data line (in this example, cathodes) group 204 cross so as to be orthogonal to each other. On portions where the scanning line group 203 and the data line group 204 cross each other (hereinafter referred to as "cross portions"), EL elements where EL materials are interposed between the scanning lines and the data lines are formed. In this example, the pixel portion 202 is a pixel portion having a structure shown in FIG. 1.

In a region surrounding (in the exterior of) the pixel portion 202, an IC where a drive circuit that transmits the respective signals to the pixel portion 202 is formed is mounting through a Chip On Glass (herein after: COG) system. This embodiment is characterized in that the IC is directed to a drive circuit formed of TFTs on a glass substrate, a quartz substrate or a plastic substrate. In the present specification, the IC having the above features is called "stick driver". It is needless to say that an IC chip where a drive circuit is formed on a silicon substrate through a known IC technique can be used.

Figure 2:
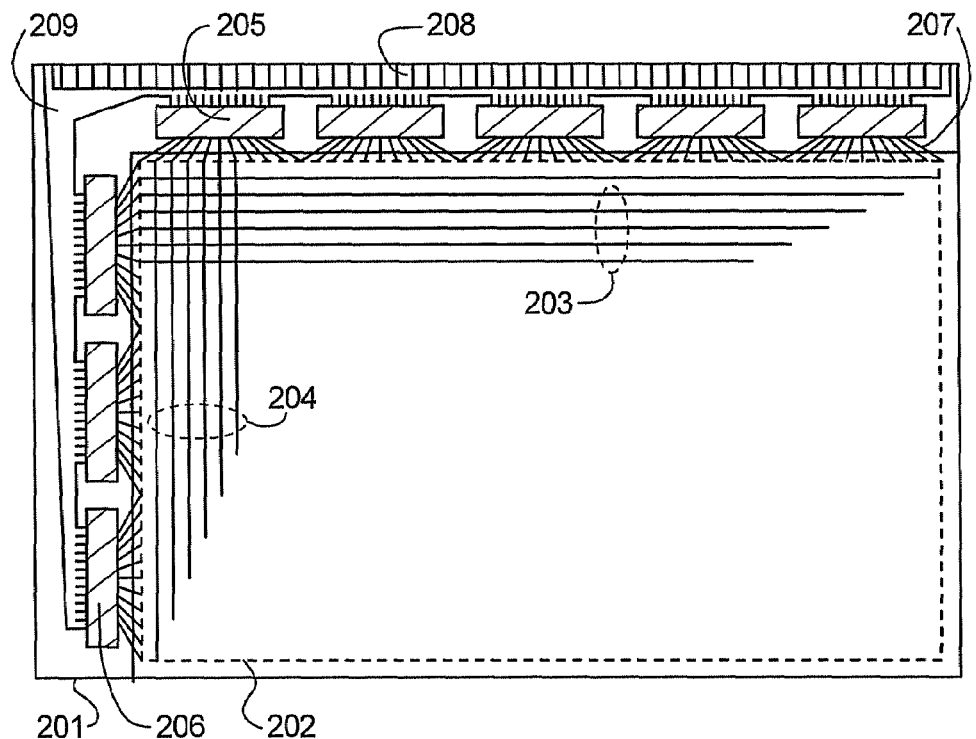
FIG. 2 is a diagram showing a top structure of the light emitting apparatus.

Referring to FIG. 2, reference numeral 205 denotes a stick driver at the data line side, and 206 is a stick driver at the scanning line side. FIG. 2 shows an example in which the stick drivers are divided into a plurality of drives and then mounted, but each one of the respective stick drivers may be used. Also, in order to form a pixel portion adapted to color display, there is required that the number of data lines is 3072 and the number of scanning lines is 768 by an XGA class. The data lines having the above number and the scanning lines having the above number are sections into groups each consisting of several blocks on the end portion of the pixel portion 202 to form lead lines 207, and the lead lines 207 are collected in correspondence with the pitches of the output terminals of the stick drivers 205 and 206.

On the other hand, the end portion of the substrate 201 is formed with input terminals 208 to which an FPC (flexible printed circuit) connected with an external circuit is stuck. Then, the external input terminals 208 and the stick drivers are connected to each other by connection wirings 209 formed on the substrate 201 and finally collected in correspondence with the pitches of the input terminals of the stick drivers.

The stick driver comprises the drive circuit 302 having TFTs, an input terminal 303, and an output terminal 304, formed on a substrate (in this example, a glass substrate) 301. It is desirable that the substrate 301 is made of a material close in the thermal expansion coefficient to the substrate 201 shown in FIG. 2, and it is desirable to use glass, quartz glass or plastic. When the material close to the thermal expansion coefficient to the substrate 201 is used, the occurrence of a stress can be suppressed to the minimum value when a heat is applied to the substrate 301, thereby being capable of preventing the connection failure or the operation failure which is caused by the stress.

Also, the TFT of the driver circuit 302 comprises an active layer, and in particular, a channel forming region comprises a polycrystalline semiconductor film or a monocrystalline semiconductor film. The poly-crystal semiconductor film and the monocrystalline semiconductor film may be formed through a known technique, respectively. Also, the TFT structure is not particularly restricted.

Figure 3:
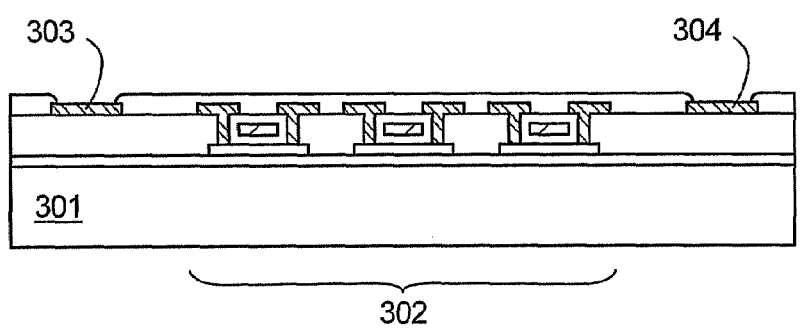
FIG. 3 is a diagram showing a cross-sectional structure of a stick driver.

A method of mounting the stick driver shown in FIG. 3 on the substrate 201 can be made by a connecting method using an isotropic electrically conductive material or a metal bump or a wire bonding system. In particular, in the case where the stick driver is formed on a wiring made of an ITO (oxide consisting of a compound of indium oxide and tin oxide), the connecting method using the isotropic electrically conductive material is preferable.

Figure 4A:
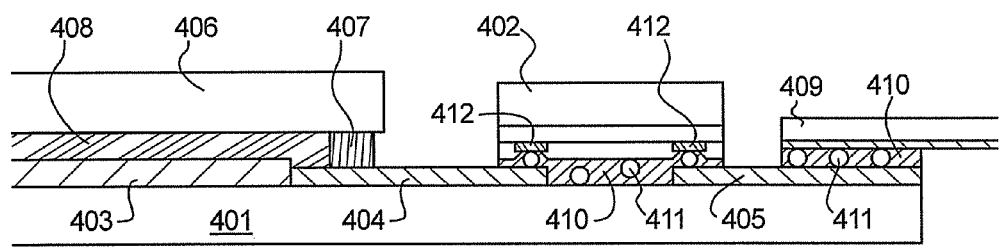
FIGS. 4A and 4B are diagrams showing examples of connection of the stick driver.
Figure 4B:
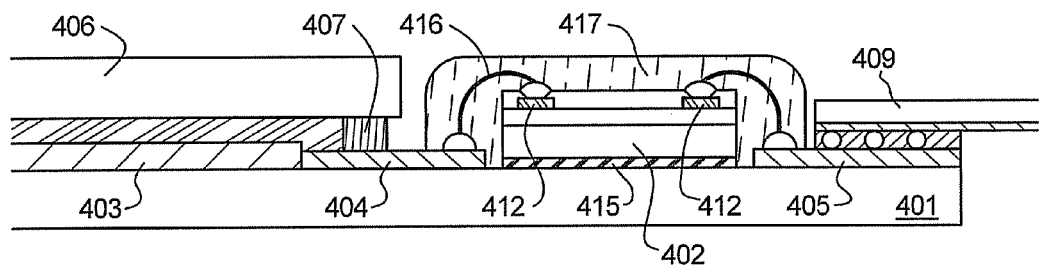

FIGS. 4A and 4B show examples of the above structure. FIG. 4A shows an example in which a stick driver 402 is mounted on a substrate 401 by using an isotropic electrically conductive material. A pixel portion 403, lead lines 404, input terminals 405 and connection wirings (not shown) are disposed on the substrate 401. The pixel portion 403 is sealed in an enclosed space by a cover material 406 and a sealant 407 so as to be protected from the atmosphere.

Also, one end of the input terminal 405 is adhered to a TCP 409 by an anisotropic electrically conductive material. The anisotropic electrically conductive material is made of a resin 410 and electrically conductive particles 411 several tens to several hundreds μm in diameter the surfaces of which are plated with a metal, and the input terminals 412 at the stick driver side or the TCP 409, and the lead wires 404 or the input terminals 405 are electrically connected to each other by the electrically conductive particles 411.

Alternatively, as shown in FIG. 4B, the stick driver may be fixed onto the substrate 401 by an adhesive 415 and the input terminals 412 of the stick driver 402 may be electrically connected to the lead wires 404 or the input terminals 405 by a metal wire 416. In this case, the connected stick driver 4002 is sealed with a resin film 417.

A method of mounting the stick driver is not limited to the method shown in FIG. 4, but known mounting methods can be used.

Second Embodiment

Figure 5A:
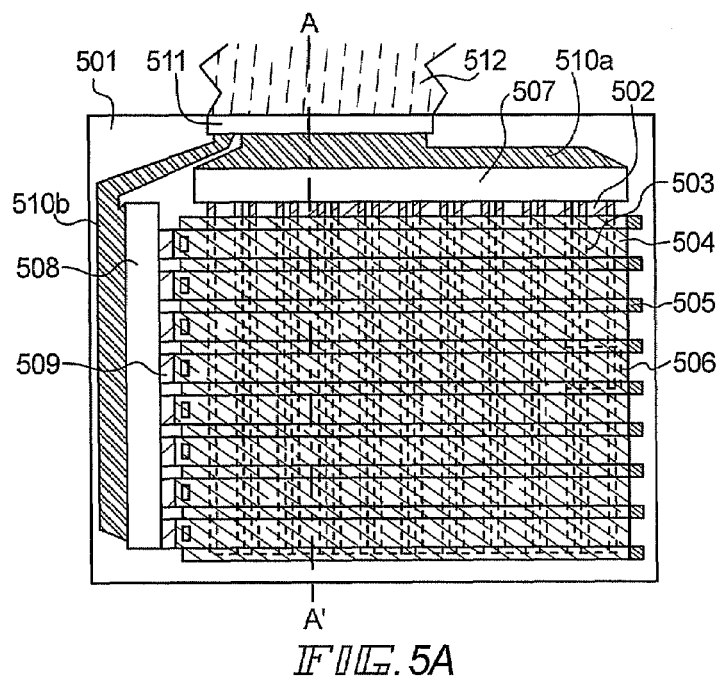
FIGS. 5A to 5C are diagrams showing a top structure and a cross-sectional structure of the light emitting apparatus.
Figure 5B:
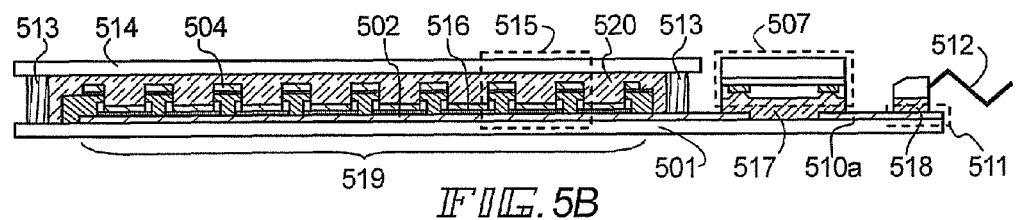

A light emitting apparatus according to another embodiment of the present invention will be described with reference to FIGS. 5A, 5B and 5C. FIG. 5A is a top view showing a light emitting apparatus according to the present invention, and FIG. 5B is a cross-sectional view taken along a line A-A' in FIG. 5A. First, the top view of FIG. 5A will be described.

Referring to FIG. 5A, reference numeral 501 denotes a substrate which is made of a plastic material in this example. Polyimide, polyamide, acrylic resin, epoxy resin, PES (polyethylene sulfite), PC (polycarbonate), PET (polyethylene terephthalate) or PEN (polyethylene nafphthalate) as the plastic material may be made in a plate or a film so as to be used as the substrate 501.

Reference numeral 502 denotes scanning lines (anodes) formed of electrically conductive oxide films, and an electrically conductive oxide film where gallium oxide is added to zinc oxide is used in this embodiment. Nickel wirings 503 are disposed on the scanning lines 502 in the same way as FIGS. 1A-1C. (refer to FIG. 5A).

Also, reference numeral 504 denotes data lines (cathodes) formed of metal films, and bismush films are used in this embodiment. Also, reference numeral 505 denotes banks which are made of acrylic resin and function as partitions for dividing the data lines 504. A plurality of scanning lines 502 and a plurality of data line 504 are formed in the form of stripes, respectively, and disposed in such a manner that they are orthogonal to each other. Although not shown in FIG. 5A, EL layers are interposed between the scanning lines 502 and the data lines 504 and cross portions indicated by reference numeral 506 form pixels.

Reference numeral 507 denotes a scanning line side stick driver which includes a driver circuit formed of TFTs. In this example, the driver circuit is formed on the plastic substrate, but may be formed on a glass substrate. The structure of the stick driver 507 is identical with that described with reference to FIG. 3. Also, although FIG. 5A shows an example in which one stick driver is disposed, the stick driver may be divided into a plurality of stick drivers.

Reference numeral 508 denotes a data line side stick driver which includes a driver circuit formed of TFTs. In this example, the driver circuit is formed on the plastic substrate. Similarly, the structure of the stick driver 508 is identical with that described with reference to FIG. 3. Also, although FIG. 5A shows an example in which one stick driver is disposed, the stick driver may be divided into a plurality of stick drivers.

The data lines 504 are electrically connected to the connection wirings 509 on the wiring end, and the connection wirings 509 are connected to the stick driver 508. This is because it is difficult to dispose the stick drivers 508 on the bank 505.

The scanning line side stick driver 507 structured as described above is connected to an FPC 512 through the connection wiring 510a and the input terminals 511. Also, the data line side stick driver 508 is connected to the FPC 512 through the connection wiring 510b and the input terminals 511.

Also, reference numeral 513 denotes a sealant, 514 is a cover material stuck onto the plastic material 501 by the sealant 513. The sealant material 513 may be made of a light curing resin, and preferably a material little in degasification and low in hygroscopicity. Also, the cover material is preferably made of the same material as that of the substrate 501, and may be made of glass (including quartz glass) or plastic. In this example, a plastic material is used for the cover material.

Subsequently, the cross-sectional view of FIG. 5B will be described. The same parts as those in FIG. 5A are designated by identical references.

Figure 5C:
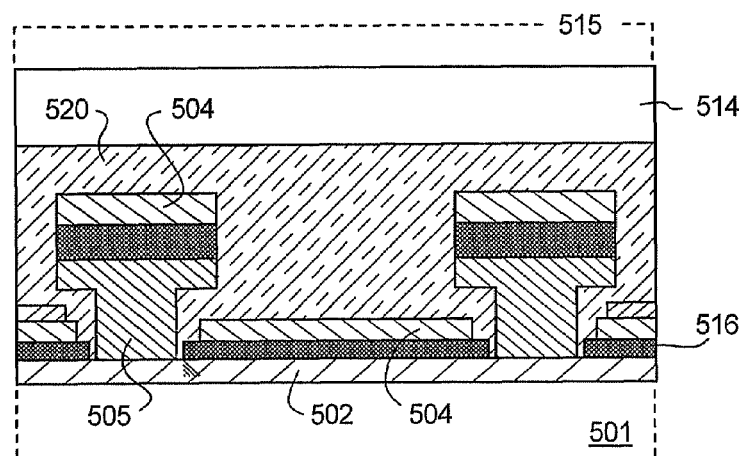

Referring to FIG. 5B, a region denoted by reference numeral 515 shows the structure of pixels, and an enlarged view is shown in FIG. 5C. Reference numeral 516 denotes an EL layer which is formed by the appropriate combination of a hole implanted layer, a hole transport layer, a light emitting layer, an electron transport layer or an electron implanted layer. It is needless to say that the light emitting layer may be formed of a single layer. The structure and the material which form the EL layer 516 may be well-known.

As shown in FIG. 5C, the lower layer of the bank 505 is narrower in width than the upper layer thereof, and the data lines 504 are physically separated.

Also, as shown in FIG. 5B, the scanning line side stick driver 507 is electrically connected to the scanning lines 502 and the connection wirings 510a by using an anisotropic electrically conductive material 517. Similarly, the FPC 512 is electrically connected to the connection wirings 510a by using an anisotropic electrically conductive material 518.

Further, the pixel portion 519 surrounded by the sealant 513 is isolated from the atmosphere by a sealant 520 made of resin so as to prevent the deterioration of the EL layer.

The light emitting apparatus thus structured according to the present invention can be fabricated through a very simple process because the pixel portion 519 is formed of the scanning lines 502, the auxiliary wirings 503, the data lines 504, the banks 505 and the EL layers 516. In addition, the provision of the auxiliary wirings 503 enables the wiring resistance of the scanning lines 502 to be reduced, thereby being capable of providing a light emitting apparatus high in display quality.

Also, a polarizing plate may be disposed on a display face (a face from which an image is observed) of the light emitting apparatus according to this embodiment. The polarizing plate has an effect of suppressing the reflection of a light made incident from the external to prevent an observer from being mirrored by the display face. In general, a circular polarizing plate is used. In order to prevent a light emitted from the EL layers from being reflected from the polarizing plate and returned to the interior, it is desirable to provide a structure in which the refractive factor is adjusted to reduce the internal reflection.

Also, the stick drivers 507 and 508 which form the driver circuits are fabricated in different processes and then mounted, respectively. As a result, because the light emitting apparatus can be fabricated without requiring a specific complicated process, the yield can be increased and the manufacturing costs can be lowered.

Third Embodiment

Figure 6:
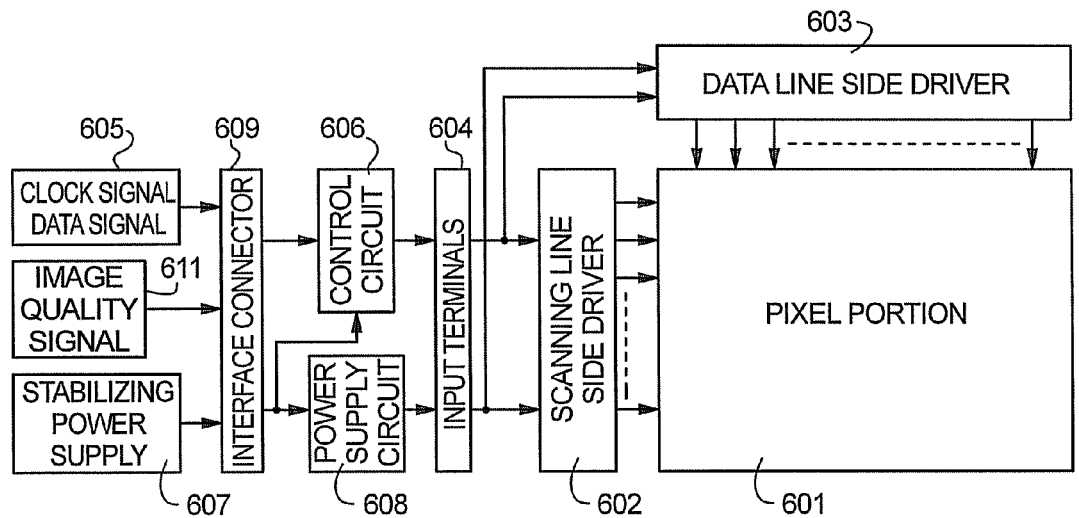
FIG. 6 is a diagram showing the structures of a light emitting apparatus and a signal inputted to the light emitting apparatus.

A circuit structure of the light emitting apparatus in accordance with an embodiment of the present invention will be shown in FIG. 6. A pixel portion 601 is formed with a plurality of scanning lines and a plurality of data lines, where a plurality of EL elements are formed. In a region surrounding the pixel portion 601, there are disposed a scanning line side driver 602 and a data line side driver 603, and stick drivers are used for those drivers (driver circuits). The structures of the stick drivers are identical with those described with reference to FIGS. 3 and 4.

Those stick drivers are connected to the input terminals 604. On a substrate where the pixel portion 601 is thus formed, there are formed the scanning line side driver 602, the data line side driver 603 and the input terminals 604.

Also, among a power supply circuit 608 including a control circuit 606, a stabilizing power supply 607 and an operational amplifier, the control circuit 606 and the power supply circuit 608 are mounted on the printed wiring board and then connected to the input terminals 604 by using the FPC. Also, an interface connector 609 is disposed on one end of the FPC, through which a clock signal, a data signal 605 and an image quality signal 611 are inputted to the printed wiring board. Also, a power supply signal from the stabilizing power supply 607 is inputted to the printed wiring board through the interface connector 609.

The clock signal and the data signal 605 which are inputted from the external are inputted to the control circuit 606 for converting a signal into the input specification of the stick drivers and then converted into the respective timing specifications.

The circuit structure according to this embodiment can be applied to the light emitting apparatus shown in the first embodiment or the second embodiment.

Fourth Embodiment

Other examples of the arrangement of the auxiliary wirings 103 in FIG. 1 are shown in FIGS. 7A to 7D and 8A to 8B. FIGS. 7A to 7D show a state where the auxiliary wirings are disposed on the anodes 102.

Figure 7A:
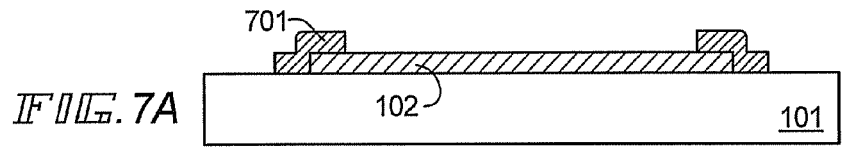
FIGS. 7A to 7D are diagrams showing examples of the arrangements of auxiliary wirings.
Figure 7B:
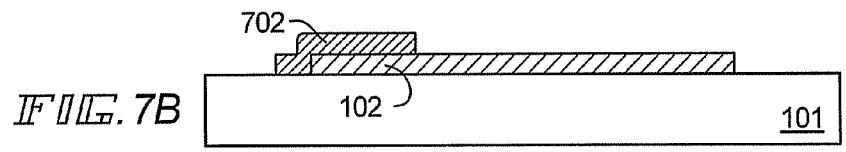

In FIG. 7A, auxiliary wirings 701 are disposed so as to cover both end portions of the anodes 102. In FIG. 7B, an auxiliary wiring 702 is disposed so as to cover one end portion of the anodes 102. In this example, since the anodes 102 and the auxiliary wiring 702 are in contact with each other with an area larger than that in FIG. 7A, the resistance is not inferior to that in the case of FIG. 7A.

Figure 7C:
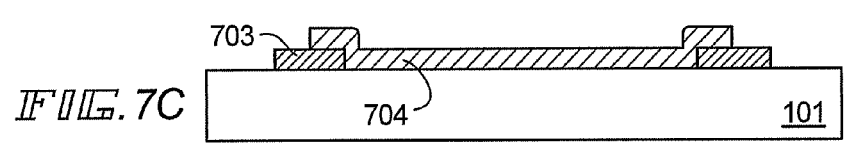
Figure 7D:
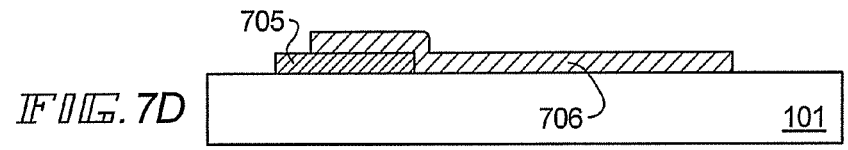

Also, in FIG. 7C, anodes 704 are so disposed as to cover the end portions of auxiliary wirings 703, and two auxiliary wirings are disposed for the anodes 704. On the other hand, in the structure shown in FIG. 7D, anodes 706 are so disposed as to cover an auxiliary wiring 705 as in FIG. 7B, and one auxiliary wiring is disposed for the anodes 706. In this example, as described with reference to FIG. 7B, since the anodes 706 and the auxiliary wiring 705 are in contact with each other with an area larger than that in FIG. 7C, the resistance is not inferior to that in the case of FIG. 7C.

Figure 8A:
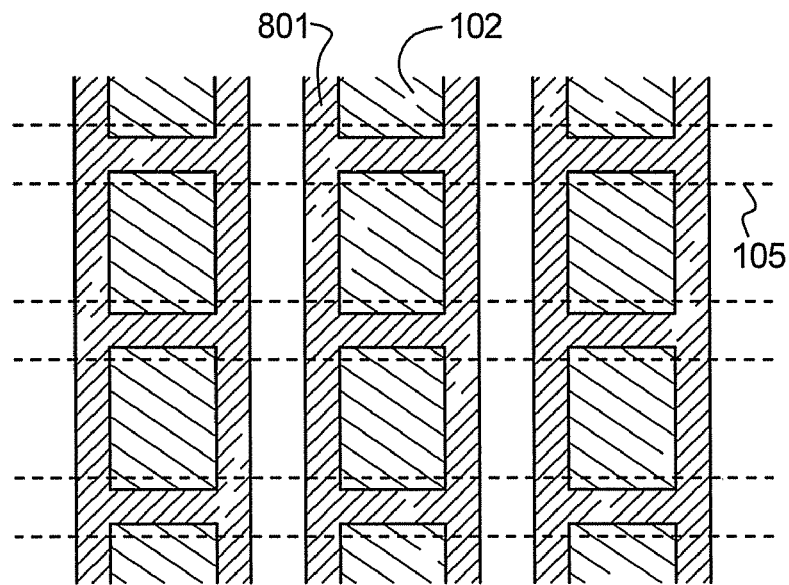
FIGS. 8A and 8B are diagrams showing examples of the arrangements of the auxiliary wirings.

FIG. 8A shows an example in which ladder-shaped auxiliary wirings 801 are disposed on the anodes 102. In this example, parts of the auxiliary wirings 801 are covered with portions on which the banks 105 will be formed later (indicated by dotted lines), thereby being capable of effectively decreasing the resistances of the anodes 102 without reducing the effective light emitting area of the pixels.

Figure 8B:
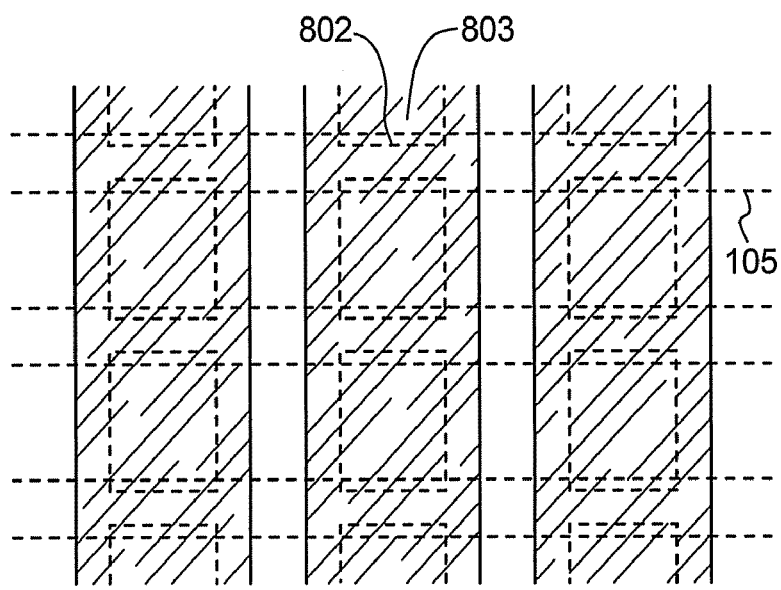

In addition, FIG. 8B is a modified example of FIG. 8A, in which anodes 803 are disposed after auxiliary wirings 802 have been formed. The configuration of the auxiliary wirings 802 is identical with the auxiliary wirings 801 shown in FIG. 8A.

It is needless to say that a manner of disposing the auxiliary wirings is not limited to the structure of this embodiment. It is desirable that the auxiliary wirings are so disposed as to be in contact with the anodes with smaller areas, to thereby decrease the resistance without reducing the effective light emitting areas of the pixels. For achieving this, as shown in FIG. 8, it is preferable to put light non-emitting portions such as the banks to practical use.

The structure according to this embodiment can be freely implemented in combination with the first embodiment or the second embodiment.

Fifth Embodiment

The above first to fourth embodiments show the cases in which the anodes, the auxiliary wirings, the EL layer and the cathodes are laminated on the insulating material in the stated order. Alternatively, the cathodes, the EL layers, the anodes and the auxiliary wirings may be laminated on the insulating material in the stated order.

In the former, a light that has passed through the insulating material is observed, whereas in the latter, a light is radiated in a direction farther away from the insulating material.

The structure according to this embodiment can be freely implemented in combination with any structure of the first to fourth embodiments.

Sixth Embodiment

A method of manufacturing the stick driver used in the first to third embodiments will be described with reference to FIGS. 9A to 9E. An example of a case where a CMOS circuit is fabricated as a basic unit for forming the driver circuit will be described.

Figure 9A:
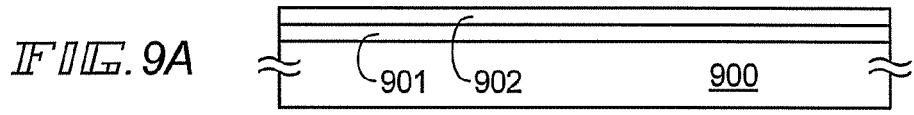
FIGS. 9A to 9H are diagrams showing a process of manufacturing the stick driver.

First, as shown in FIG. 9A, a base film 901 is formed in thickness of 300 nm on a glass substrate 900. In this embodiment, silicon nitride oxide film is laminated on the base film 901 as a base film 902. In this example, it is better that the concentration of nitrogen of the base film which is in contact with the glass substrate 900 is set to 10 to 25 wt %.

Subsequently, an amorphous silicon film (not shown) 50 nm in thickness is formed on the base film 901 through a known film forming method. The present invention is not limited to the amorphous silicon film, but may be applicable with any films if it is a semiconductor film having an amorphous structure (including a micro-crystal semiconductor film). Also, a compound semiconductor film having an amorphous structure such as an amorphous silicon germanium film may be used. Further, the thickness of that film may be set to 20 to 100 nm.

The amorphous silicon film is crystallized through a known technique, to thereby form a crystalline silicon film (also called "polycrystalline silicon film" or "poly-silicon film") 902. The known crystallizing methods are a thermal crystallizing method using a thermoelectric furnace, a laser annealing crystallizing method using a laser beam and a lamp annealing crystallizing method using infrared rays.

In this embodiment, using a technique disclosed in Japanese Patent Application Laid-open No. Hei 7-130652, nickel is added to the amorphous silicon film, and furnace annealing is conducted to crystallize the amorphous silicon film. Nickel is used as catalytic that promotes the crystallization.

In this embodiment, the crystalline silicon film is used as an active layer of the TFT, but an amorphous silicon film may be used. Also, it is possible that the active layer of the switching TFT which requires a reduction of an off-state current is formed of the amorphous silicon film, and the active layer of a current control TFT is formed of the crystalline silicon film. It is difficult to make a current flow in the amorphous silicon film and to make the off-state current flora in the amorphous silicon film because the carrier mobility is low. In other words, the advantages of both of the amorphous silicon film that makes the current difficult to flow therein and the crystalline silicon film that makes the current easy to flow therein can be utilized.

Figure 9B:
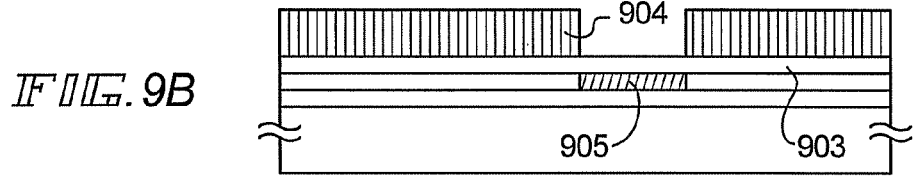

Subsequently, as shown in FIG. 9B, a protective film 903 formed of a silicon oxide film is formed in thickness of 130 nm on the crystalline silicon film 902. The thickness of the protective film 903 may be selected from a range of from 100 to 200 nm (preferably from 130 to 170 nm). Also, another film may be used for the protective film 903 if it is an insulating film containing silicon therein. The protective film 903 is provided for the purposes of preventing the crystalline silicon film from being directly exposed to plasma when impurities are added to the crystalline silicon film, and of enabling a fine concentration control.

Then, a resist mask 904 is formed on the protective film 903, and impurity elements (hereinafter referred to as "n-type impurity elements") that give n-type are added to the layer through the protective film 903. The n-type impurity elements may be representatively elements belonging to Group 15 of the periodic table, typically phosphorus or arsenic. In this embodiment, phosphorus is added in the concentration of $1 \times 10^{18}$ atoms/cm$^3$ by using a plasma doping method where plasma is excited without mass-separating phosphine (PH$_3$). It is needless to say that an ion implantation method that conducts mass separation may be used instead.

The dose amount is adjusted in such a manner that the n-type impurity elements $2 \times 10^{16}$ to $5 \times 10^{19}$ atoms/cm$^3$ (representatively $5 \times 10^{17}$ to $5 \times 10^{18}$ atoms/cm$^3$) in concentration are contained in the n-type impurity region 905 which is formed through the above process.

Figure 9C:
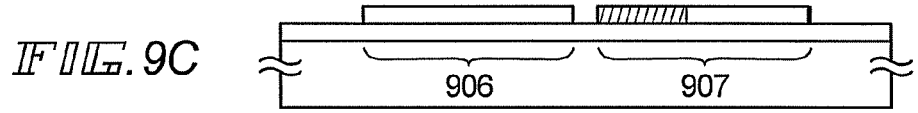

Then, as shown in FIG. 9C, unnecessary portions of the crystalline silicon film are removed, to thereby form a semiconductor film 906 which will form the active layer of a p-channel TFT and a semiconductor film 907 that will form the active film of an n-channel TFT.

Figure 9D:
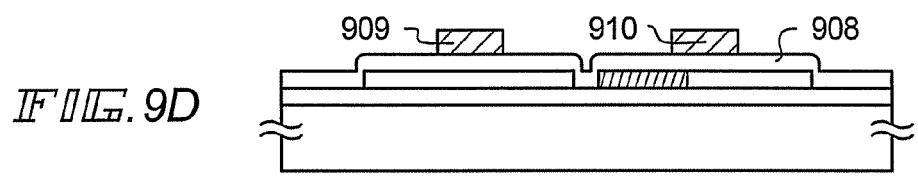

Then, as shown in FIG. 9D, a gate insulating film 908 is so formed as to cover the semiconductor films 906 and 907. The gate insulating film 908 may be formed of an insulating film containing silicon 10 to 200 nm, preferably 50 to 150 nm in thickness. The insulating film may be of a single-layer structure or a laminate structure.

Then, an electrically conductive film 200 to 400 nm in thickness is formed and then patterned, to thereby form gate electrodes 909 and 910. End portions of the gate electrodes 909 and 910 may be tapered. Also, each of the gate electrodes 909 and 910 may be formed of a single-layer electrically conductive film, but it is preferable that the gate electrode is of a laminate film such as two layers or three layers as occasion demands. The material of the gate electrodes may be a known so-called electrically conductive film.

Representatively, there can be used a film made of elements selected from a group consisting of tantalum (Ta), titanium (Ti), molybdenum (Mo), tungsten (W), chromium (Cr), and silicon (Si), a nitride film of the above elements (representatively, a tantalum nitride film, a tungsten nitride film and a titanium nitride film), an alloy film that combines the above elements together (representatively, Mo—W alloy, Mo—Ta alloy), or a silicide film of the above elements (representatively, a tungsten silicide film and a titanium silicide film). It is needless to say that the above electrically conductive film may be of a single layer or a laminate layer.

In this embodiment, a laminate film consisting of a tungsten nitride (WN) film 50 nm in thickness and a tungsten (W) film 350 nm in thickness is used. The laminate film may be formed through a sputtering method. Also, if an inactive gas such as Xe or Ne is added as a sputtering gas, a film peeling due to a stress can be prevented.

In this situation, the gate electrode 910 is so formed as to overlap on a part of the n-type impurity region 905 through the gate insulating film 908. The overlapping portion will form an LDD region which overlaps on the gate electrode later.

Figure 9E:
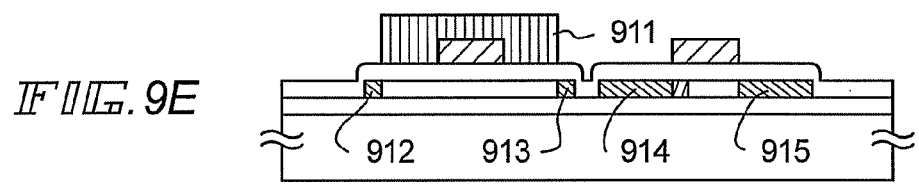

Then, as shown in FIG. 9E, a resist 911 is formed and n-type impurity elements (phosphorus in this embodiment) are added, to thereby form impurity regions 912 to 915 containing phosphorus with a high concentration. In this process, the concentration of phosphorus is adjusted to $1\times10^{20}$ to $1\times10^{21}$ atoms/cm$^3$ (representatively $2\times10^{20}$ to $5\times10^{21}$ atoms/cm$^3$) by using an ion doping method using phosphine (PH$_3$). Through this process, the source region and the drain region of the n-channel TFT are formed.

This process is characterized in that n-type impurity regions 912 and 913 are formed even in the semiconductor film 906 which forms the active layer of the p-channel TFT. Those regions 912 and 913 are required in a post-process in order to getter nickel used for crystallization of the amorphous silicon film.

Figure 9F:
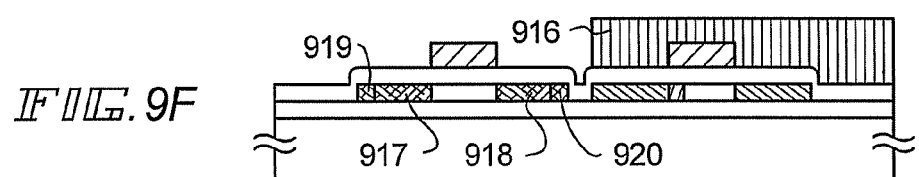

Subsequently, as shown in FIG. 9F, the resist mask 911 is removed, and a resist 916 is newly formed. Then, p-type impurity elements (in this embodiment, boron) are added, to thereby form impurity regions 917 and 918 containing boron with a high concentration. In this process, boron is added to the regions in such a manner that the concentration of boron becomes $3\times10^{20}$ to $3\times10^{21}$ atoms/cm$^3$ (representatively $5\times10^{20}$ to $1\times10^{21}$ atoms/cm$^3$) through the ion doping method using diborane (B$_2$H$_6$).

Phosphorus has been already added in concentration of $1\times10^{20}$ to $1\times10^{21}$ atoms/cm$^3$ to regions denoted by reference numeral 919 and 920, and the concentration of boron added in this process is at least three times as high as that of phosphorus. For that reason, the n-type impurity regions 912 and 913 formed in advance are completely reversed to p-type and functions as parts of p-type impurity regions of the p-channel TFT.

Figure 9G:
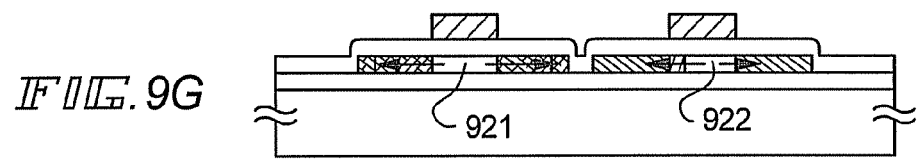

Then, after removal of the resist mask 916, as shown in FIG. 9G, the n-type or p-type impurity elements which have been added with the respective concentrations are activated. The activating means can be conducted by a furnace annealing method, a laser annealing method or a lamp annealing method. In this embodiment, a heat treatment is conducted in a thermoelectric furnace in a nitrogen atmosphere at 550° C. for 4 hours.

In this situation, nickel used in crystallization is moved to the n-type impurity regions 914, 915 and the p-type impurity regions 919 and 920 from the channel forming regions 921 and 922 and gettered. In other words, nickel is gettered by phosphorus contained in the n-type impurity regions 914, 915 and the p-type impurity regions 919, 920. Through this process, the concentration of nickel in the channel forming regions 921 and 922 can be set to $1\times10^{17}$ atoms/cm$^3$ or less (preferably $1\times10^{16}$ atoms/cm$^3$ or less). Conversely, nickel is segregated in the n-type impurity regions 914, 915 and the p-type impurity regions 919, 920 so that nickel exists in those regions with the concentration of $5\times10^{19}$ atoms/cm$^3$ or more (representatively $1\times10^{19}$ to $5\times10^{20}$ atoms/cm$^3$).

Subsequently, as shown in FIG. 9A, an interlayer insulating film 923 is formed. The interlayer insulating film 923 may be formed of a single layer consisting of an insulating film containing silicon or a laminate film that combines those insulating films containing silicon together. Also, the thickness of the interlayer insulating film 923 may be set to 400 nm to 1.5 μm. In this embodiment, a silicon oxide film 800 nm in thickness is laminated on a silicon nitride oxide 200 nm in thickness.

In addition, a heat treatment is conducted in an atmosphere containing hydrogen of 3 to 100% at 300 to 450° C. for 1 to 12 hours to conduct a hydrogenating process. This process is a process of hydrogen-terminating the dangling bond of the semiconductor film due to hydrogen thermally excited. As another hydrogenating means, plasma hydrogenation (using hydrogen excited due to plasma) may be conducted.

The hydrogenating process may be conducted while the interlayer insulating film 923 is formed. That is, the hydrogenating process may be conducted as described above after the silicon nitride oxide film 200 nm in thickness has been formed, and thereafter a subsequent silicon oxide film 800 nm in thickness may be formed.

Then, contact holes are formed in the first interlayer insulating film 923, and source wirings 924, 925 and a drain wiring 926 are formed. At the same time, an input terminal 303 and an output terminal 304 as shown in FIG. 3 may be formed. In this embodiment, each of the electrodes is formed of a laminate film of a three-layer structure in which a Ti (titanium) film 100 nm in thickness, an aluminum film containing Ti 300 nm in thickness and a Ti film 150 nm in thickness are continuously formed through a sputtering method. Of course, another electrically conductive film may be used for the electrodes.

Then, a passivation film 927 is formed in a thickness of 50 to 500 nm (representatively 200 to 300 nm). In this embodiment, a silicon nitride oxide film 300 nm in thickness is used as the passivation film 927. This film may be replaced by a silicon nitride film.

It is effective that a plasma process is conducted by using gas containing hydrogen such as H$_2$ or NH$_3$ prior to the formation of the silicon nitride oxide film. Hydrogen excited through the fore-process is supplied to the interlayer insulating film 923 and a heat treatment is conducted on the interlayer insulating film 923, to thereby improve the film quality of the passivation film 927. At the same time, because hydrogen added to the interlayer insulating film 923 diffuses toward the lower layer side, the active layer can be effectively hydrogenated.

Figure 9H:
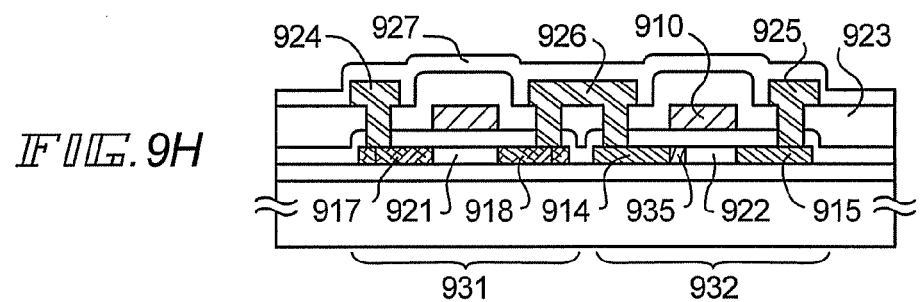

In the above manner, a CMOS circuit that complementarily combines the p-channel TFT 931 and the n-channel TFT 932 with the structure shown in FIG. 9H is completed. In this embodiment, the active layer of the p-channel TFT 931 is formed of the source region 917, the drain region 918 and the channel forming region 921.

Also, the active layer of the n-channel TFT 932 includes the source region 915, the drain region 914 and the LDD region 935 and the channel forming region 922, and the LDD region 935 overlaps on the gate electrode 910 through the gate insulating film 908. The length of a region of the LDD region 935 which overlaps on the gate electrode 910 in the channel longitudinal direction is set to 0.5 to 3.0 μm, preferably 1.0 to 2.0 μm.

The above structure is extremely effective in suppressing the deterioration due to the hot-carrier effect. The reason that the LDD region 935 is formed on only the drain region 914 side is to prevent the operating speed from decreasing. Because the hot carrier effect in the vicinity of the joint portion of the drain region and the channel forming region leads to a problem, the sufficient effect is obtained by the provision of the hot carrier effect on the drain region side. The hot carrier effect may be provided on the source region side, likewise.

In this embodiment, the method of manufacturing the CMOS circuit is described. However, in fact, the driver circuit is formed of the combination of the CMOS circuit, the NMOS circuit or the PMOS circuit. In this case, a method of fabricating the p-channel TFT 931 may be referred to in the fabrication of the PMOS circuit, and a method of fabricating the n-channel TFT 932 may be referred to in the fabrication of the NMOS circuit.

The structure according to this embodiment can be freely implemented by the combination of any structures of the first to fifth embodiments.

Seventh Embodiment

Figure 10:
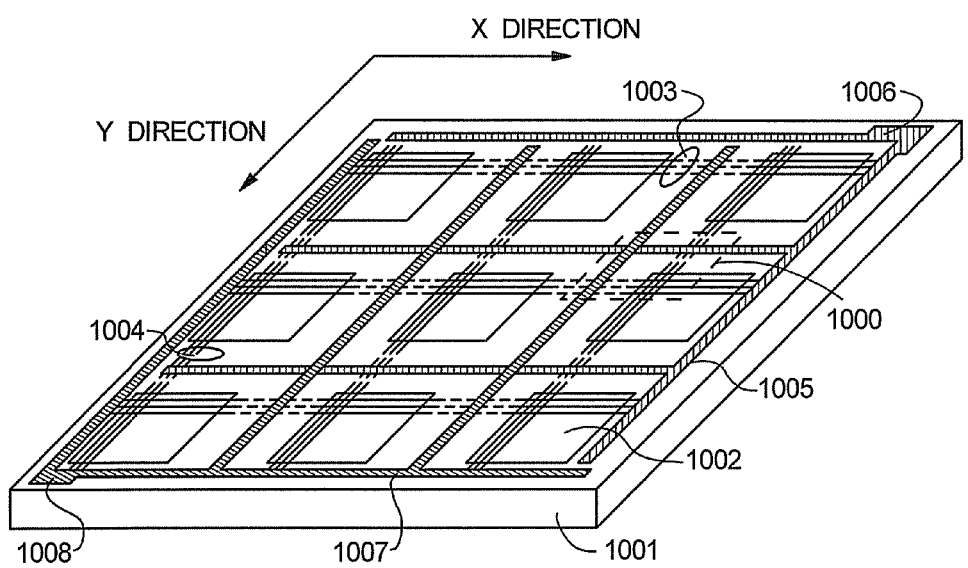
FIG. 10 is a diagram showing an example of multiple beveling processes.

This embodiment shows a case of manufacturing a plurality of light emitting apparatuses from a single large-sized glass substrate through multiple beveling processes as shown in FIG. 10.

A plurality of pixel portions 1002 are formed on a glass substrate 1001. In this embodiment, nine pixel portions, that is, nine light emitting apparatuses are formed on a single glass substrate. Also, each pixel is structured as shown in FIG. 1, in which anodes 1003 are formed in an X-direction in the figure and cathodes 1004 are formed in a Y-direction.

In this embodiment, there are formed wirings (hereinafter referred to as "anode connection wirings") 1005 for connecting the respective anodes 1003 in such a manner that all of the anodes 1003 become identical in potential, and if a voltage is applied to an anode pad 1006, the voltage is applied to all of the anodes. Similarly, there are formed wirings (hereinafter referred to as "cathode connection wirings") 1007 for connecting the respective cathodes 1004 in such a maimer that all of the cathodes 1004 become identical in potential, and if a voltage is applied to a cathode pad 1008, the voltage is applied to all of the cathodes.

The feature of this embodiment resides in that the anode connection wirings 1005 and the cathode connection wirings 1007 are effectively used for a countermeasure against static electricity. In other words, because a large voltage is not suddenly applied between the wirings if all of the anodes 1003 and the cathodes 1004 are identical in potential, respectively, a dielectric breakdown and so on can be effectively suppressed.

An enlarged view of a region 1000 surrounded by a dotted line is shown in FIG. 11A. Reference numeral 1105 denotes an auxiliary wiring.

As shown in FIG. 11A, the anode connection wirings 1005 and the cathode connection wirings 1007 are formed at the same time. That is, both of the anode connection wirings 1005 and the cathode connection wirings 1007 are formed in the same layer which is formed of the same metal film. In this situation, the anode connection wirings 1005 have portions coupled to each other by buffer wirings 1101 formed together with the anodes 1003. Also, the cathode connection wirings 1007 have portions coupled to each other by buffer wirings 1102 and 1103 formed together with the anodes 1003 and buffer wirings 1104 formed together with the cathodes 1007.

A cross-sectional view taken along a line A-A' in FIG. 11A is shown in FIG. 11B, a cross-sectional view taken along a line B-B' in FIG. 11A is shown in FIG. 11C, and a cross-sectional view taken along a line C-C' in FIG. 11A is shown in FIG. 11D. Reference numeral 1106 denotes a separation insulating film.

The buffer wirings 1101 to 1103 comprise the same material as that of the anodes, and typically wirings formed of an electrically conductive oxide film. Because the electrically conductive oxide film is higher in resistance than the metal film, the buffer wirings function as a sort of resistor. For that reason, even if a large current flows in the anode connection wirings 1005 or the cathode connection wirings 1007, the large current is buffered by the buffer wirings, thereby being capable of preventing a plurality of light emitting apparatuses from suffering from damages.

Also, upon completion of the light emitting apparatuses, the substrate 1001 may be divided into the individual light emitting apparatuses by using a dicer or a scriber. In this situation, if the anode connection wirings 1005 and the cathode connection wirings 1007 are also divided at the same time, the respective light emitting apparatuses are electrically isolated from each other.

It is possible to provide the stick drivers described in the first to sixth embodiments, as occasion demands, before or after the substrate 1001 is divided into the respective light emitting apparatuses.

Eighth Embodiment

In this embodiment, an external light emitting quantum efficiency can be remarkably improved by using an EL material by which phosphorescence from a triplet exciton can be employed for emitting a light. As a result, the power consumption of the EL element can be reduced, the lifetime of the EL element can be elongated and the weight of the EL element can be lightened.

The following is a report where the external light emitting quantum efficiency is improved by using the triplet exciton (T. Tsutsui, C. Adachi, S. Saito, Photochemical processes in organized molecular systems, ed. K. Honda, (Elsevier Sci. Pub., Tokyo, 1991) p. 437).

The molecular formula of an EL material (coumarin pigment) reported by the above article is represented as (Chemical formula 1) in the attached sheets. (M. A. Baldo, D. F. O'Brien, Y. You, A. Shoustikov, S. Sibley, M. E. Thompson, S. R. Forrest, Nature 395 (1998) p.151)

The molecular formula of an EL material (Pt complex) reported by the above article is represented as (Chemical formula 2) in the attached sheets. (M. A. Baldo, S. Lamansky, P. E. Burrows, M. E. Thompson, S. R. Forrest, Appl. Phys. Lett., 75 (1999) p.4.) (T. Tsutsui, M. -J. Yang, M. Yahiro, K. Nakamura, T. Watanabe, T. Tsuji, Y. Fukuda, T. Wakimoto, S. Mayaguchi, Jpn, Appl. Phys., 38 (12B) (1999) L1502)

The molecular formula of an EL material (Ir complex) reported by the above article is represented as (Chemical formula 3) in the attached sheets.

As described above, if phosphorescence from a triplet exciton can be put to practical use, it can realize the external light emitting quantum efficiency three to fourth times as high as that in the case of using fluorescence from a singlet exciton in principle. The structure according to this embodiment can be freely implemented in combination of any structures of the first to seventh embodiments.

Ninth Embodiment

The light emitting apparatus formed according to the present invention, is a self light emitting type, therefore compared to a liquid crystal display device, it has excellent visible properties and is broad in an angle of visibility. Accordingly, it may be used as a display portion of various electric devices. In such a case, since the light emitting apparatus of this invention is a passive type light emitting device but may have a large size screen by decreasing the wiring resistance, it may be used in various situations.

As other electronic equipments of the present invention there are: a video camera; a digital camera; a goggle type display (head mounted display); a car navigation system; a car audio stereo; a notebook type personal computer; a game apparatus; a portable information terminal (such as a mobile computer, a portable telephone, a portable game machine, or an electronic book); and an image playback device equipped with a recording medium (specifically, device provided with a display portion which plays back images in a recording medium such as a compact disc player (CD), a laser disk player (LD), or a digital versatile disk Player (DVD), and displays the images). Specific examples of those electronic equipments are shown in FIGS. 12A to 12F.

Figure 12A:
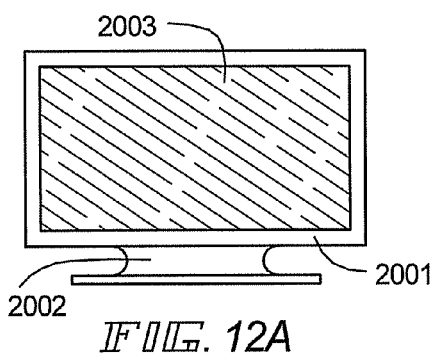
FIGS. 12A to 12F are diagrams showing examples of electric devices.

FIG. 12A shows an EL display containing a casing 2001, a support stand 2002, and a display portion 2003. The light emitting device of the present invention can be used as the display portion 2003. Such an EL display is a self light emitting type so that a back light is not necessary. Thus, the display portion can be made thinner than that of a liquid crystal display. Note that, if a stick driver is provided in the light emitting device used in the display portion 2003, it is preferable that it is dividedly provided in several tens of parts.

Figure 12B:
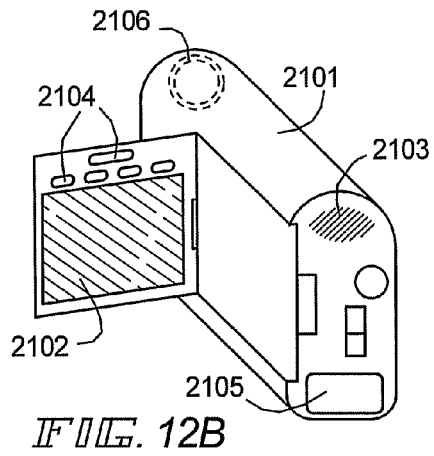

FIG. 12B shows a video camera, and contains a main body 2101, a display portion 2102, a sound input portion 2103, operation switches 2104, a battery 2105, and an image receiving portion 2106. The light emitting device of the present invention can be used as the display portion 2102. Note that, if a stick driver is provided in the light emitting device used in the display portion 2102, it is preferable that it is dividedly provided in several parts.

Figure 12C:
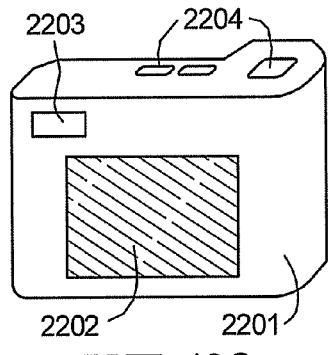

FIG. 12C shows a digital camera, and contains a main body 2201, a display portion 2202, an eye piece portion 2203, and operation switches 2204. The light emitting device of the present invention can be used as the display portion 2202. Note that, if a stick driver is provided in the light emitting device used in the display portion 2202, it is preferable that it is dividedly provided in several parts.

Figure 12D:
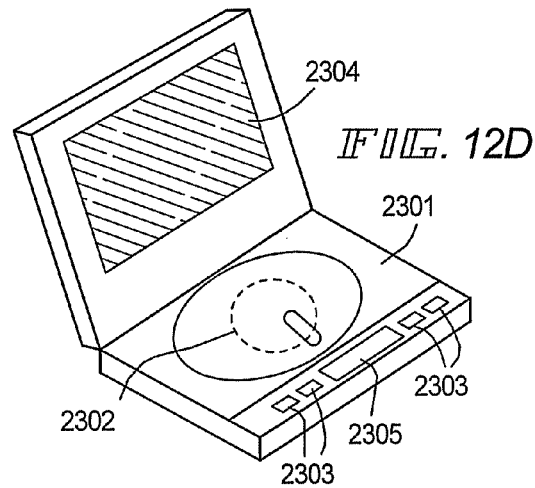

FIG. 12D is an image playback device equipped with a recording medium (specifically, a DVD playback device), and contains a main body 2301, a recording medium (such as a CD, LD or DVD) 2302, operation switches 2303, a display portion (a) 2304, and a display portion (b) 2305. The display portion (a) 2304 is mainly used for displaying image information. The display portion (b) 2305 is mainly used for displaying character information. The light emitting device of the present invention can be used as the display portion (a) 2304 and as the display portion (b) 2305. Note that the image playback device equipped with the recording medium includes devices such as CD playback devices and game machines. Note that, if a stick driver is provided in the light emitting device used in the display portion (b) 2305, it is preferable that it is dividedly provided into several tens of parts.

Figure 12E:
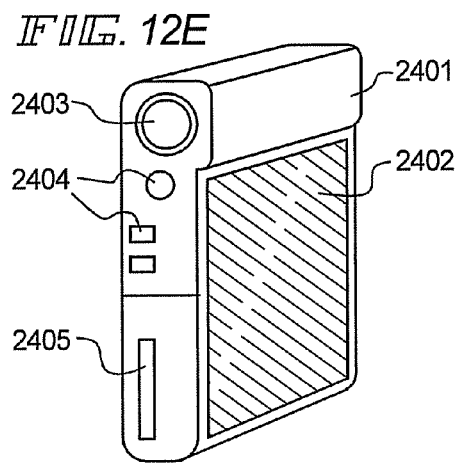

FIG. 12E shows a portable (mobile) computer, and contains a main body 2401, a camera portion 2402, an image receiving portion 2403, operation switches 2404, and a memory slot 2405. The electrooptical device of the present invention can be used as the display portion 2402. This portable computer can record or play back information in the recording medium which is an accumulation of flash memory or involatile memory. Note that, if a stick driver is provided in the light emitting device used in the display portion 2402, it is preferable that it is dividedly provided in several tens of parts.

Figure 12F:
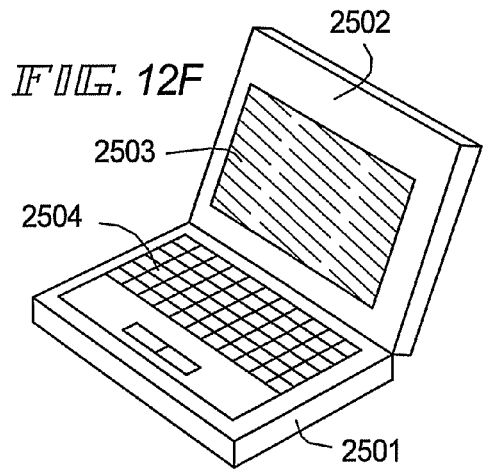

FIG. 12F is a personal computer, and contains a main body 2501, a casing 2502, a display portion 2503, and a keyboard 2504. The light emitting device of the present invention can be used as the display portion 2503. Note that, if a stick driver is provided in the light emitting device used in the display portion 2503, it is preferable that it is dividedly provided in several tens of parts.

Note that if the luminance increases in the future, then it will become possible to use the light emitting device of the present invention in a front type or a rear type projector by expanding and projecting light containing output image information with a lens or the like.

Further, the above electric devices display often information transmitted through an electronic communication circuit such as the Internet and CATV (cable tv)., and particularly situations of displaying moving images is increasing.

In addition, since the light emitting device conserves power in the light emitting portion, it is preferable to display information so as to make the light emitting portion as small as possible. Consequently, when using the light emitting device in a display portion mainly for character information, such as in a portable information terminal, in particular a portable telephone or a car audio stereo, it is preferable to drive the light emitting device so as to form character information by the light emitting portions while non-light emitting portions are set as background.

Figure 13A:
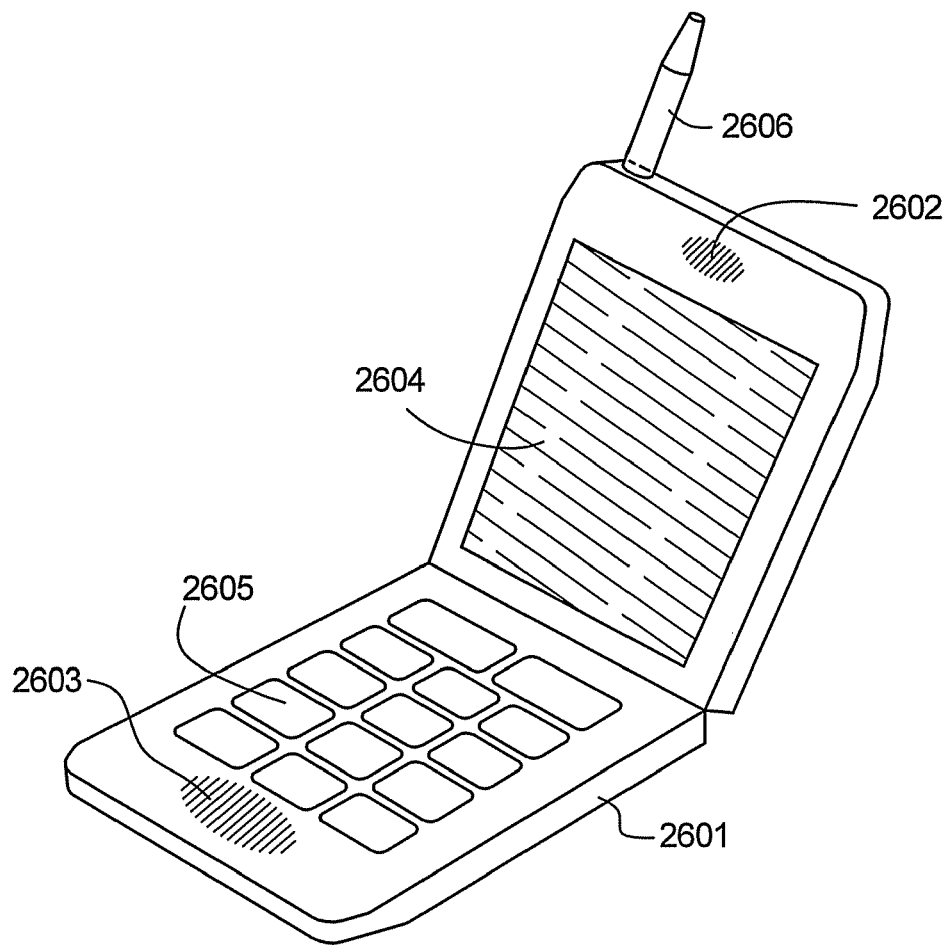
FIGS. 13A and 13B are diagrams showing examples of the electric devices.

FIG. 13A shows a portable telephone, and contains a main body 2601, a sound output portion 2602, a sound input portion 2603, a display portion 2604, operation switches 2605, and an antenna 2606. The light emitting device of the present invention can be used as the display portion 2604. Note that by displaying white color characters in a black color background, the display portion 2604 can suppress the power consumption of the portable telephone.

Figure 13B:
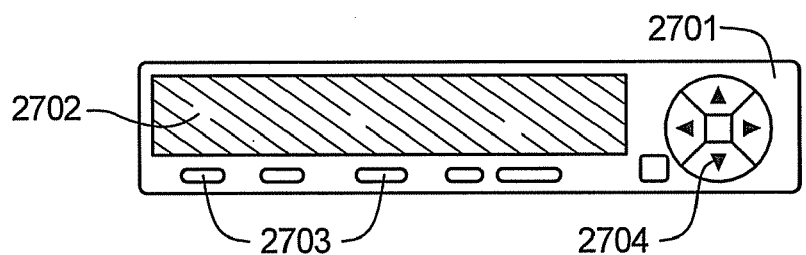

FIG. 13B shows a car audio stereo, and contains a main body 2701, a display portion 2702, and operation switches 2703 and 2704. The light emitting device of the present invention can be used as the display portion 2702. Further, a car mounting audio stereo is shown in this embodiment, but a fixed type audio playback device may also be used.

Note that, by displaying white color characters in a black color background, the display portion 2704 can suppress the power consumption. Note that, if a stick driver is provided in the light emitting device used in the display portion 2704, it is preferable that it is dividedly provided in several parts.

As described above, the application range of this invention is extremely wide, and it may be used for electric devices in various fields. Further, the electric device of this embodiment may be obtained by using a light emitting device freely combining the structures of the first to eighth embodiments.

In a passive matrix light emitting device according to this invention, in particular it is possible to reduce the wiring resistance of an anode made of a conductive oxide film. Thus, it becomes possible to suppress the residual image phenomenon by the fluctuation of image quality due to wiring resistance or wiring delay. Further, by using such a light emitting apparatus as a display portion, an electric device with high display quality may be obtained.

The foregoing description of the preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A light emitting apparatus having at least one light emitting element over an insulator, the light emitting element comprising;
    an anode having a first end portion and a second end portion formed over said insulator, the anode extending in a first direction wherein each of the first end portion and the second end portion of the anode extends along said first direction;
    a first wiring and a second wiring, wherein the first wiring is formed over and in contact with the first end portion of the anode, the second wiring is formed over and in contact with the second end portion of the anode, the first wiring and the second wiring extend in the first direction, and the first wiring and the second wiring are not part of the anode;
    an insulating film covering both edge portions of the anode along the first direction, the first wiring, and the second wiring, wherein the insulating film has a planarized surface over the both edge portions of the anode, the first wiring and the second wiring;
    an electroluminescent layer formed over the insulating film and the anode, wherein the electroluminescent layer is in direct contact with a part of the anode; and
    a cathode formed over the electroluminescent layer.

2. An apparatus according to claim 1, wherein the first wiring and the second wiring are formed of metal films.

3. An apparatus according to claim 2, wherein said metal films comprise platinum, palladium, nickel, gold, aluminum, copper, silver, tantalum, tungsten, molybdenum or titanium.

4. An apparatus according to claim 1, wherein said anode is formed of electrically conductive oxide films.

5. An electric device using an apparatus according to claim 1.

6. An apparatus according to claim 1, wherein the first wiring and the second wiring are different in material from said anode.

7. An apparatus according to claim 1, wherein the first wiring and the second wiring are made of a material lower in resistance than that of said anode.

8. An apparatus according to claim 1, wherein the insulator does not contact with the electroluminescent layer.

9. A light emitting apparatus having at least one light emitting element over an insulator, the light emitting element comprising:
    an anode having a first end portion and a second end portion formed over said insulator, the anode extending in a first direction, wherein each of the first end portion and the second end portion of the anode extends along said first direction, wherein said anode is electrically connected to a first driver circuit which is mounted by a COG system;
    a first wiring and a second wiring, wherein the first wiring is formed over and in contact with the first end portion of the anode, the second wiring is formed over and in contact with the second end portion of the anode, the first wiring and the second wiring extend in the first direction, and the first wiring and the second wiring are not part of the anode;
    an insulating film covering both edge portions of the anode along the first direction, the first wiring and the second wiring, wherein the insulating film has a planarized surface over the both edge portions of the anode, the first wiring and the second wiring;
    an electroluminescent layer formed over the insulating film and the anode, wherein the electroluminescent layer is in direct contact with a part of the anode; and
    a cathode formed over the electroluminescent layer, wherein said cathode is electrically connected to a second driver circuit which is mounted by the COG system.

10. An apparatus according to claim 9, wherein the first wiring and the second wiring are formed of metal films.

11. An apparatus according to claim 10, wherein said metal films comprise platinum, palladium, nickel, gold, aluminum, copper, silver, tantalum, tungsten, molybdenum or titanium.

12. An apparatus according to claim 9, wherein said anode is formed of electrically conductive oxide films.

13. An apparatus according to claim 9, further comprising a plurality of banks arranged so as to be orthogonal to said anode.

14. An apparatus according to claim 9, wherein the insulator does not contact with the electroluminescent layer.

15. A light emitting apparatus having at least one light emitting element over an insulator, the light emitting element comprising:
    an anode having a first end portion and a second end portion formed over said insulator, the anode extending in a first direction;
    a first wiring and a second wiring, wherein the first wiring is formed over and in contact with the first end portion of the anode, the second wiring is formed over and in contact with the second end portion of the anode, the first wiring and the second wiring extend in the first direction, and the first wiring and the second wiring are not part of the anode;
    an insulating film covering both edge portions of the anode along the first direction, the first wiring and the second wiring, wherein the insulating film has a planarized surface over the both edge portions of the anode, the first wiring and the second wiring;

an electroluminescent layer formed over the insulating film and the anode, wherein the electroluminescent layer is in direct contact with a part of the anode; and a cathode formed over the electroluminescent layer.

16. An apparatus according to claim 15, wherein the first wiring and the second wiring are formed of metal films.

17. An apparatus according to claim 15, wherein said anode is formed of electrically conductive oxide films.

18. An electric device using an apparatus according to claim 15.

19. An apparatus according to claim 15, wherein the first wiring and the second wiring are different in material from said anode.

20. An apparatus according to claim 15, wherein the first wiring and the second wiring are made of a material lower in resistance than that of said anode.

21. An apparatus according to claim 15, wherein the insulator does not contact with the electroluminescent layer.

* * * * *